(12) United States Patent
Peng et al.

(10) Patent No.: US 7,640,968 B2
(45) Date of Patent: Jan. 5, 2010

(54) HEAT DISSIPATION DEVICE WITH A HEAT PIPE

(75) Inventors: Xue-Wen Peng, Shenzhen (CN); Rui-Hua Chen, Shenzhen (CN)

(73) Assignees: Fu Zhun Precision Industry (Shen Zhen) Co., Ltd., Shenzhen City, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 282 days.

(21) Appl. No.: 11/695,434

(22) Filed: Apr. 2, 2007

(65) Prior Publication Data

US 2008/0156459 A1   Jul. 3, 2008

(30) Foreign Application Priority Data

Dec. 27, 2006   (CN)   .................... 2006 1 0157761

(51) Int. Cl.
*H05K 7/20*   (2006.01)
(52) U.S. Cl. ................. 165/80.3; 165/104.33; 165/121; 361/697; 361/700
(58) Field of Classification Search ........................ None
See application file for complete search history.

(56) References Cited

U.S. PATENT DOCUMENTS

| | | | | |
|---|---|---|---|---|
| 5,583,746 A | * | 12/1996 | Wang | .......................... 361/697 |
| 6,945,318 B2 | * | 9/2005 | Ma et al. | ................ 165/104.33 |
| 6,945,319 B1 | * | 9/2005 | Li et al. | .................. 165/104.33 |
| 7,273,091 B2 | * | 9/2007 | Bahl et al. | .................... 165/121 |
| 7,286,353 B2 | * | 10/2007 | Yu et al. | ...................... 361/697 |
| 7,333,336 B2 | * | 2/2008 | Kim | ............................ 361/709 |
| 2004/0129409 A1 | * | 7/2004 | Mok | ........................... 165/80.3 |
| 2006/0102324 A1 | * | 5/2006 | Mok et al. | ............. 165/104.33 |
| 2006/0118948 A1 | * | 6/2006 | Lin | ............................. 257/712 |

\* cited by examiner

*Primary Examiner*—Allen J Flanigan
(74) *Attorney, Agent, or Firm*—Frank R. Niranjan

(57) ABSTRACT

A heat dissipation device includes a base (10), a heat radiator (40) mounted on the base (10), and two heat pipes (20) connecting the base (10) and the heat radiator (40). The base (10) has a bottom face adapted for contacting with a heat-generating electronic component. The heat pipes (20) each comprise an evaporating portion (22) embedded in the base (10) and a condensing portion (24) extending from an end of the evaporating portion (22). The heat radiator (40) comprises first and second fin assemblies (42, 44) each having two contacting faces (43, 45), the condensing portions (24) of the heat pipes (20) are sandwiched between the contacting faces (43, 45) by the first and second fin assemblies (42, 44), and an opening is enclosed by the first and second fin assemblies (42, 44) and receives an electric fan (50) therein.

8 Claims, 4 Drawing Sheets

HEAT DISSIPATION DEVICE WITH A HEAT PIPE

BACKGROUND OF THE INVENTION

1. Field of the Invention

The present invention relates to a heat dissipation device for computer add-on cards and particularly a heat dissipation device mounted onto a graphics card for dissipating heat generated by the graphics card.

2. Description of Related Art

In order to enable desktop and other computers to rapidly process graphics and game technology, add-on units, generally referred to as "graphics cards" are often installed in computer devices. Such cards comprise a separate processor, called a GPU (graphics processor unit). When a GPU operates at high speed in a computer enclosure, its temperature is greatly increased. It is desirable to dissipate the heat quickly, for example by using a heat dissipation device attached to the GPU in the enclosure. This allows the GPU and other electronic components in the enclosure to function within their normal operating temperature ranges, thereby assuring the quality of data management, storage and transfer.

A conventional heat dissipation device comprises a heat sink and a pair of heat pipes. The heat sink comprises a base and a plurality of fins extending from the base. The base has a bottom surface attached to an electronic component and defines two grooves at a top surface opposite the bottom surface. Each heat pipe has a heat-receiving portion accommodated in one of the grooves and a pair of heat-discharging portions extending from opposite free ends of the heat-receiving portion and inserted into the top fins. The base absorbs heat produced by the electronic component and transfers the heat directly to the fins through the heat pipes. By the provision of the heat pipes heat dissipation efficiency of the heat dissipation device is improved.

However, due to structural limitations, the contact area between the heat pipes and the fins is limited, which results in the heat dissipation efficiency by the conventional heat dissipation device still cannot meet the increasing heat removal requirements of the modern heat-generating electronic devices. Furthermore, when such a conventional heat dissipation device is used to dissipate heat from the GPU of a graphics card, it cannot be equipped with an electric fan to generate an airflow forcibly expelling the heat from the fins, since a space between the graphics card a neighboring card is so limited that to install the electric fan on the fins is impracticable.

SUMMARY OF THE INVENTION

According to an embodiment of the present invention, a heat dissipation device comprises a base, a heat radiator mounted on the base, and two heat pipes connecting the base and the heat radiator. The base has a bottom face adapted for contacting with a heat-generating electronic component. The heat pipes each comprise an evaporating portion embedded in the base and a condensing portion extending from an end of the evaporating portion. The heat radiator comprises first and second fin assemblies each having an arc-shaped configuration with two contacting faces at two ends thereof, the condensing portions of the heat pipes are sandwiched between the contacting faces by the first and second fin assemblies, and a round opening is enclosed by the first and second fin assemblies. An electrical fan is received in the opening and generates a forced airflow through the fin assemblies when the fan is in operation.

Other advantages and novel features will become more apparent from the following detailed description of preferred embodiment when taken in conjunction with the accompanying drawings.

BRIEF DESCRIPTION OF THE DRAWINGS

Many aspects of the present heat dissipation device can be better understood with reference to the following drawings. The components in the drawings are not necessarily drawn to scale, the emphasis instead being placed upon clearly illustrating the principles of the present heat dissipation device. Moreover, in the drawings, like reference numerals designate corresponding parts throughout the several views.

DETAILED DESCRIPTION OF THE INVENTION

Figure 1:
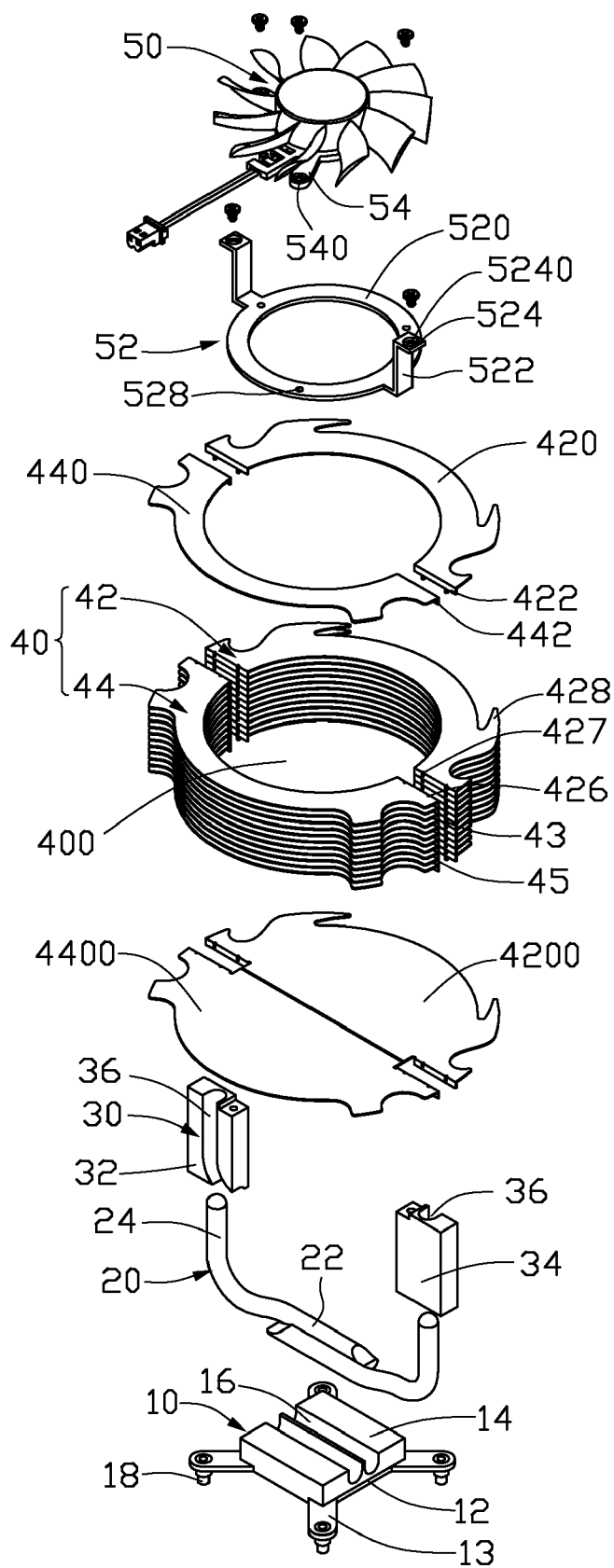
FIG. 1 is an exploded, isometric view of a heat dissipation device in accordance with a preferred embodiment of the present invention.
Figure 2:
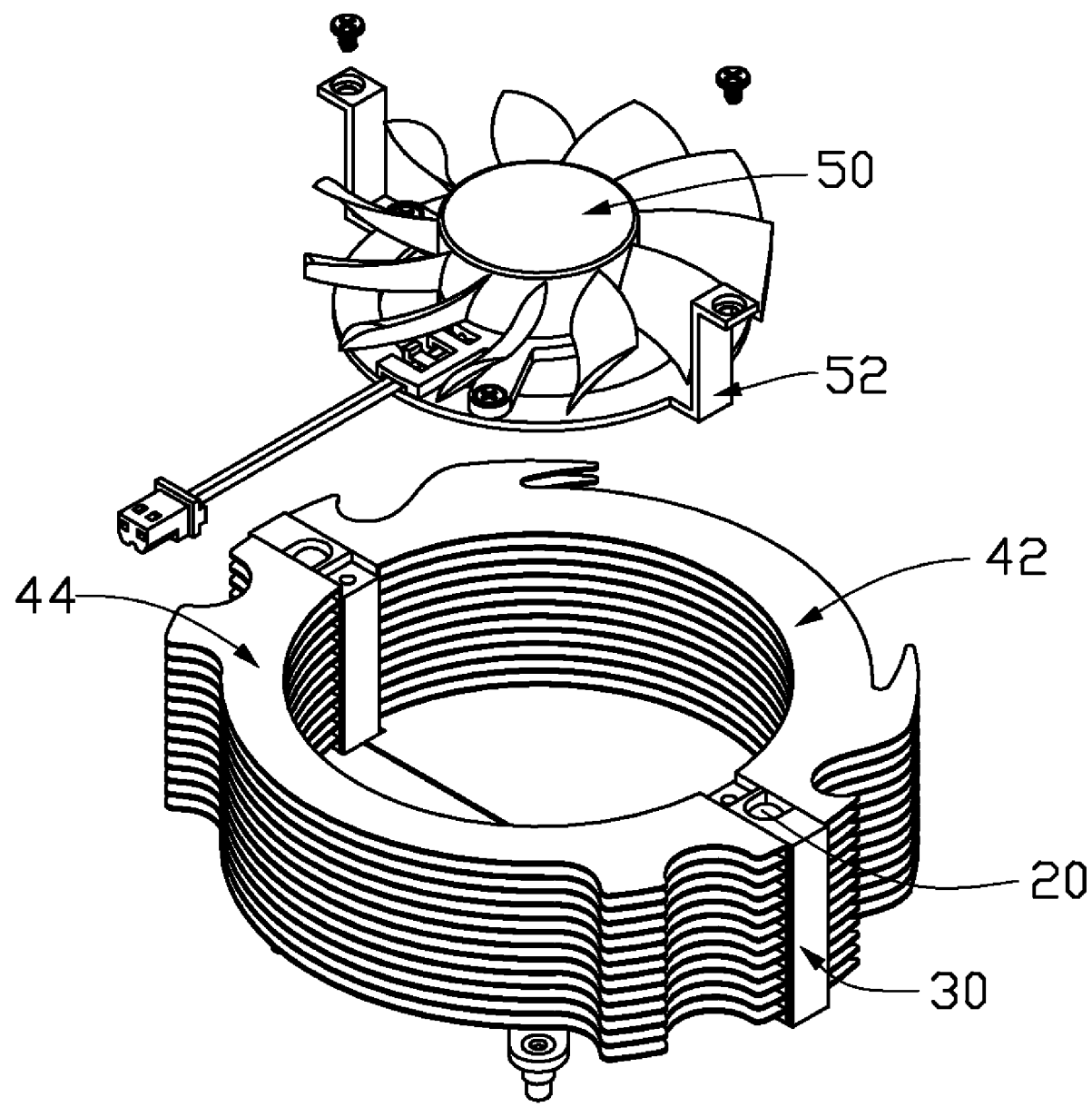
FIG. 2 is a partially assembled view of FIG. 1.

FIG. 1 shows a heat dissipating device (not labeled) in accordance with a preferred embodiment of the present invention. The heat dissipation device includes a base 10, two heat spreaders 30, two L-shaped heat pipes 20 thermally connecting the base 10 and the heat spreaders 30, a hollow heat radiator 40 comprising a first fin assembly 42 and a second fin assembly 44 which together sandwich the heat pipes 20 and the heat spreaders 30 therebetween, and an axial flow fan 50 mounted in the heat radiator 40.

The base 10 has a bottom face (not labeled) for engaging with a GPU (not shown) mounted on a printed circuit board of a graphics card 60 (FIG. 4) to absorb heat therefrom, and a top face 14 having two adjoining grooves 16. Two mounting brackets 12 each with a pair of ears 13 are attached to opposite bottom sides of the base 10. The base 10 thermally engages with the GPU mounted on the printed circuit board by extending four fasteners 18 through the four ears 13 to threadedly engage with a retainer (not shown) attached to a bottom side of the printed circuit board.

Each heat pipe 20 is L-shaped, and comprises a horizontal evaporating portion 22 and a vertical condensing portion 24 extending upwards from an outside end of the evaporating portion 22. The evaporating portions 22 of the heat pipes 20 are soldered in the grooves 16 of the base 10. The condensing portions 24 are positioned at opposite sides of the base 10 in such a manner that the heat absorbed by the heat pipes 20 can be evenly transferred to the whole of the radiator 40.

Each heat spreader 30 is made of highly heat-conductive metal, such as copper or aluminum, and has two opposite faces 32, 34 for engaging with the heat radiator 40. Each heat spreader 30 defines a groove 36 at the face 32 thereof. The condensing portion 24 of each heat pipe 20 is received in the groove 36. A depth of each groove 36 is substantially equal to an outer diameter of each heat pipe 20. As such, after the condensing portion 24 of each heat pipe 20 is positioned in the groove 36, an exposed outer surface of each heat pipe 20 is coplanar with the face 32 of the heat spreader 30. The two faces 32 having the grooves 36 of the heat spreaders 30 are placed back to back.

The heat radiator 40 comprises the first fin assembly 42 and the second fin assembly 44. The first and the second assemblies 42, 44 each have a substantially arc-shaped configuration. The first and the second assemblies 42, 44 are approximately symmetrical and cooperatively define a central opening 400 therebetween. The opening 400 is round in shape. The first and the second assemblies 42, 44 each have two perpendicular contacting faces 43, 45 at two ends thereof. Two receiving space are defined between the faces 43, 45 of the first and the second assemblies 42, 44 for receiving the heat pipes 20 and the heat spreaders 30 therein.

The first and second fin assemblies 42, 44 respectively comprise a plurality of first fins 420 and second fins 440. The fins 420, 440 are approximately semi-annular and parallel to the base 10. The fins 420, 440 have two ends (not labeled). The fins 420, 440 form flange 422, 442 perpendicularly and downwardly extending from edges at the ends. The flanges 422, 442 separate the fins 420, 440 at uniform intervals. The flanges 422, 442 respectively form clasps 426, 427 thereon. The fins 420, 440 respectively snappingly clasp with each other via the clasps 426, 427. The flanges 422, 442 of the fins 420, 440 respectively form the contacting faces 43, 45. Two ears 428 extend from the outside edge of each first fin 420.

The first and second fin assemblies 42, 44 respectively have a bottom fin 4200, 4400 located close to the base 10. The bottom fins 4200, 4400 each have a substantially semi-circular configuration. After the first fin assembly 42 and the second fin assembly 44 are assembled, a bottom of the opening 400 is sealed by the bottom fins 4200, 4400 for receiving the fan 50. The heat radiator 40 has a plurality of channels defined between the first and second fins 420, 440 communicating the opening 400 of the heat radiator 40 with an exterior of the radiator 40.

Figure 3:
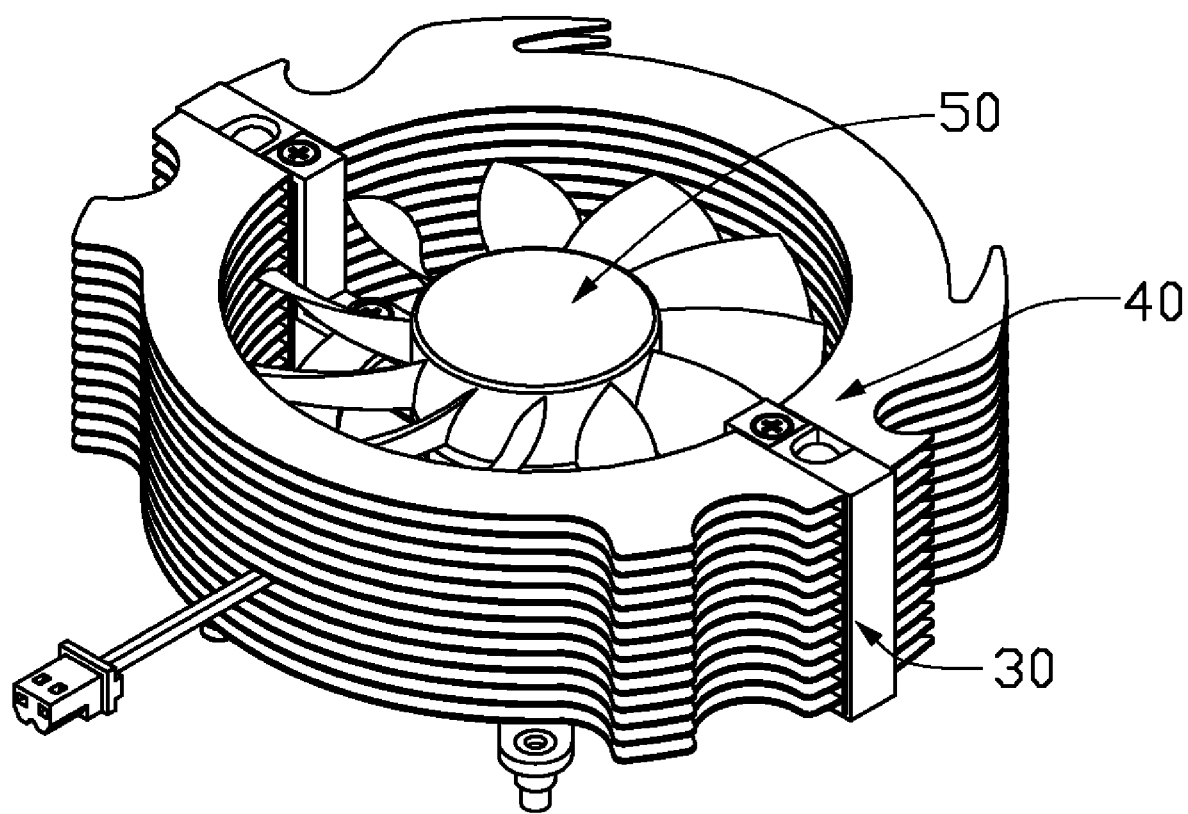
FIG. 3 is an assembled view of FIG. 1.

Referring also to FIG. 3, the fan 50 is secured in the opening 400 of the radiator 40 by a bracket 52 mounted on the heat spreaders 30. A main axis of the fan 50 is vertical to the extension direction of the channels of the heat radiator 40. The bracket 52 comprises an annular base 520, two L-shaped connecting portions 522 extending outwardly and upwardly from two opposite edges of the base 520 and two mounting portions 524 outwardly and horizontally extending from the top edges of the connecting portions 522. Each of the mounting portions 524 defines a through hole 5240 therein. Screws (not labeled) extend through the through holes 5240 and engage with top portions of the heat spreaders 30 to secure the bracket 52 to the heat spreaders 30. The base 520 of the bracket 52 defines three screw holes 528 therein. The fan 50 comprises three legs 54 defining three through holes 540 corresponding to the screw holes 528 of the base 520. Screws (not labeled) extend through the through holes 540 and engage in the screw holes 528 of the base 520 to secure the fan 50 to the bracket 52. Thus, the fan 50 is secured in the opening 400 of the heat radiator 40.

Figure 4:
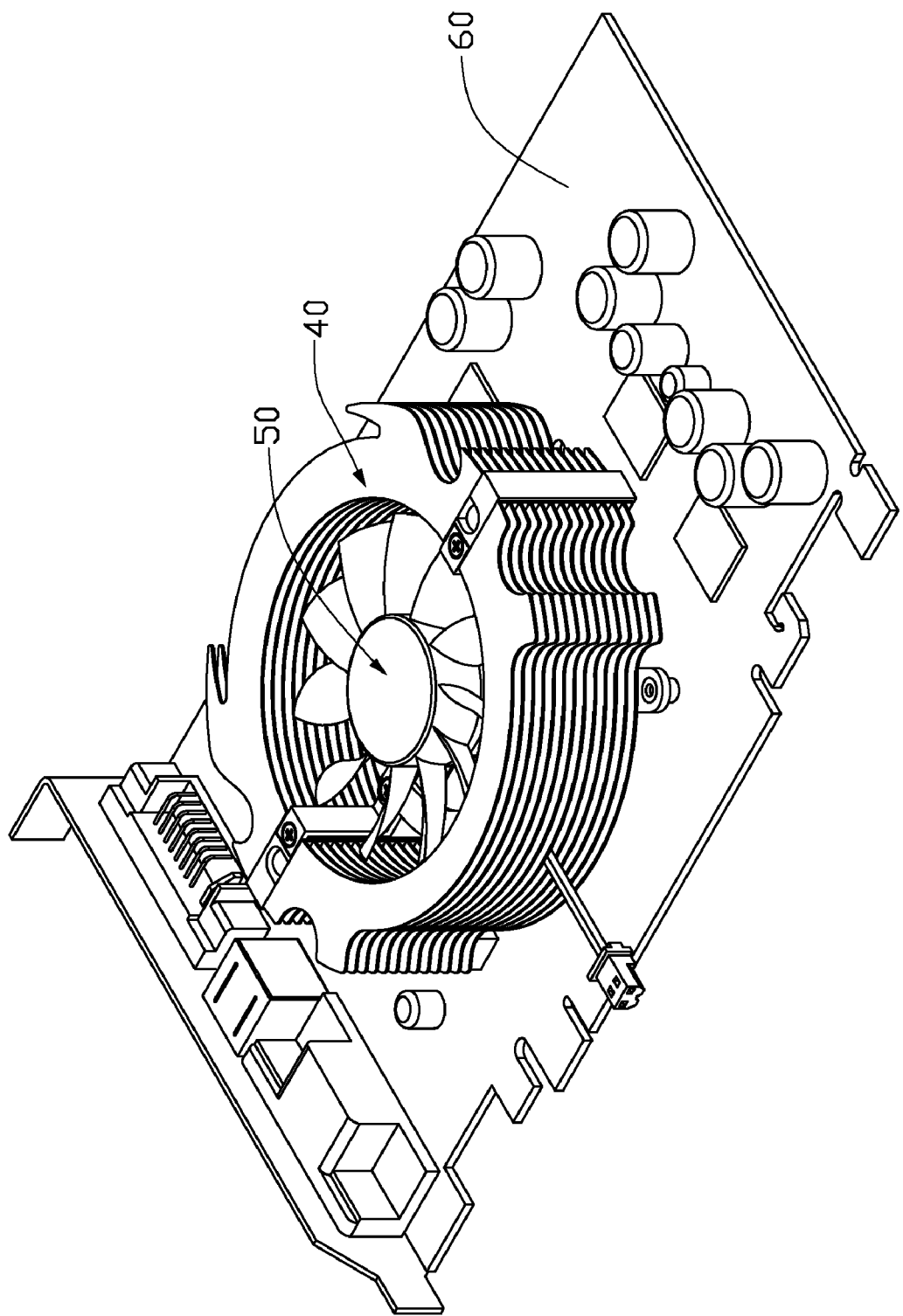
FIG. 4 is an assembled view of the heat dissipation device of FIG. 3 secured on a graphics card.

Referring also to FIG. 4, the heat dissipating device is installed onto the graphics card 60 for dissipating the heat generated by the GPU (not shown) on the graphics card 60. The bottom of the base 10 of the heat dissipation device contacts a top surface of the GPU. When the GPU is in use, the base 10 absorbs heat generated by the GPU. Then the heat accumulated on the base 10 is absorbed by the evaporating portions 22 of the heat pipes 20 and transferred to the condensing portions 24. The heat absorbed by the condensing portions 24 is transferred to the heat radiator 40 via the heat spreaders 30. Thus the heat generated by the GPU can be quickly and evenly transferred to the whole of the heat radiator 40. An airflow generated by the fan 50 passes through the channels of the first and second fin assemblies 42, 44 to take away the heat absorbed by the radiator 40. The fan 50 is mounted closed to the first and second fin assemblies 42, 44 in a manner such that the airflow is strong enough to pass through the first and second fin assemblies 42, 44; heat dissipation efficiency of the heat dissipation device is improved accordingly. The airflow also takes away heat from the other heat-generating electronic components (not shown) beside the GPU.

In the preferred embodiment, the fan 50 is an axial flow fan. The fin 4200 of the first fin assembly 42 and the fin 4400 of the second fin assembly 44 enclose the bottom of the radiator 40 to lead the airflow generated by the fan 50 to pass through the first fin assembly 42 and the second fin assembly 44. When the fan 50 is a centrifugal fan, the airflow generated by the fan 50 can directly flow through the channels of the radiator 40. Alternatively, the fin 4200 of the first fin assembly 42 and the fin 4400 of the second fin assembly 44 can be omitted when the fan 50 is a centrifugal fan.

Alternatively, the heat spreaders 30 also can be omitted. The heat pipes 20 can be flattened and directly contact the first fin assembly 42 and the second fin assembly 44, or the first fin assembly 42 and the second fin assembly 44 can define two grooves (not shown) in the contacting faces 43, 45 thereof for directly receiving the condensing portions 24 of the heat pipes 20. The two L-shaped heat pipes 20 can combine to form a U-shaped heat pipe comprising an evaporating portion and two condensing portions.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat dissipation device comprising:
   a base having a bottom face adapted for contacting with a heat-generating electronic component;
   two heat pipes each comprising an evaporating portion embedded in the base and a condensing portion extending from an end of the evaporating portion;
   a heat radiator mounted on a top face of the base opposite to the bottom face and comprising first and second fin assemblies each having two contacting faces, the condensing portions of the two heat pipes sandwiched between the contacting faces by the first and second fin assemblies, and an opening enclosed by the first and second fin assemblies;
   two heat spreaders receiving the condensing portions of the heat pipes and sandwiched between the contacting faces of the first and second fin assemblies; and
   a fan mounted in the opening;
   wherein each of the first and second fin assemblies has a substantially arc-shaped configuration and comprises a plurality of semi-annular fins, the fins are separated from each other at uniform intervals to define channels communicating the opening of the heat radiator with an exterior of the radiator; and
   wherein the fan is an axial flow fan, and bottom fins of the first and second fin assemblies have semi-circular configurations for enclosing a bottom of the opening.

2. The heat dissipation device as described in claim 1, wherein the heat pipes are L-shaped, and the two evaporating portions received in the base are adjacent and parallel to each other.

3. The heat dissipation device as described in claim 1, wherein the fan is secured in the opening of the radiator via a bracket mounted on the heat spreaders.

4. The heat dissipation device as described in claim 3, wherein the bracket comprises an annular base engaging with the fan, two connecting portions extending outwardly and upwardly from two opposite edges of the base and two mounting portions outwardly extending from the top edges of the connecting portions.

5. A heat dissipation device comprising:

a base having a bottom face adapted for contacting with a heat-generating electronic component;

two heat pipes each comprising an evaporating portion embedded in the base and a condensing portion extending from an end of the evaporating portion;

a heat radiator mounted on a top face of the base opposite to the bottom face and comprising first and second fin assemblies each having two contacting faces, the condensing portions of the two heat pipes sandwiched between the contacting faces by the first and second fin assemblies, and an opening enclosed by the first and second fin assemblies;

two heat spreaders receiving the condensing portions of the heat pipes and sandwiched between the contacting faces of the first and second fin assemblies; and a fan mounted in the opening;

wherein the fan is secured in the opening of the radiator via a bracket mounted on the heat spreaders; and wherein the bracket comprises an annular base engaging with the fan, two connecting portions extending outwardly and upwardly from two opposite edges of the base and two mounting portions outwardly extending from top edges of the connecting portions.

6. The heat dissipation device as described in claim 5, wherein the heat pipes are L-shaped, and the two evaporating portions received in the base are adjacent and parallel to each other.

7. The heat dissipation device as described in claim 5, wherein each of the first and second fin assemblies has a substantially arc-shaped configuration and comprises a plurality of semi-annular fins, the fins are separated from each other at uniform intervals to define channels communicating the opening of the heat radiator with an exterior of the radiator.

8. The heat dissipation device as described in claim 7, wherein the fan is a centrifugal flow fan.

\* \* \* \* \*